United States Patent
Hwang et al.

(10) Patent No.: US 9,172,008 B2
(45) Date of Patent: Oct. 27, 2015

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Kyung Wook Hwang, Hwaseong-si (KR); Jung Sub Kim, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/158,729

(22) Filed: Jan. 17, 2014

(65) Prior Publication Data

US 2014/0203292 A1    Jul. 24, 2014

(30) Foreign Application Priority Data

Jan. 24, 2013   (KR) .................. 10-2013-0008310

(51) Int. Cl.
| | |
|---|---|
| H01L 33/00 | (2010.01) |
| H01L 33/50 | (2010.01) |
| H01L 33/12 | (2010.01) |
| H01L 33/10 | (2010.01) |
| H01L 33/26 | (2010.01) |
| H01L 33/32 | (2010.01) |
| H01L 33/08 | (2010.01) |
| H01L 33/24 | (2010.01) |

(52) U.S. Cl.
CPC ............... *H01L 33/50* (2013.01); *H01L 33/10* (2013.01); *H01L 33/12* (2013.01); *H01L 33/08* (2013.01); *H01L 33/24* (2013.01); *H01L 33/26* (2013.01); *H01L 33/32* (2013.01); *H01L 33/507* (2013.01)

(58) Field of Classification Search
CPC .......... H01L 33/12; H01L 33/26; H01L 33/32
USPC ............................................... 257/79, 94, 98
See application file for complete search history.

(56) References Cited

U.S. PATENT DOCUMENTS

| | | | |
|---|---|---|---|
| 7,868,341 B2 | 1/2011 | Diana et al. | |
| 2009/0159869 A1* | 6/2009 | Ponce et al. | 257/13 |
| 2011/0156071 A1 | 6/2011 | Cheng et al. | |
| 2011/0156073 A1* | 6/2011 | Park et al. | 257/98 |
| 2011/0233589 A1 | 9/2011 | Kim et al. | |
| 2012/0126203 A1 | 5/2012 | Knapp | |
| 2012/0187444 A1* | 7/2012 | Oh et al. | 257/99 |
| 2013/0234178 A1* | 9/2013 | Mitsugi et al. | 257/94 |
| 2013/0328056 A1* | 12/2013 | Kwon et al. | 257/76 |

FOREIGN PATENT DOCUMENTS

| | | |
|---|---|---|
| JP | 2008-243961 A | 10/2008 |
| JP | 2008-270707 A | 11/2008 |
| JP | 2010-040976 A | 2/2010 |
| JP | 2010-087324 A | 4/2010 |
| KR | 10-2010-0052936 A | 5/2010 |
| KR | 10-0993112 B1 | 11/2010 |

* cited by examiner

*Primary Examiner* — David Vu
*Assistant Examiner* — Brandon Fox
(74) *Attorney, Agent, or Firm* — McDermott Will & Emery LLP

(57) ABSTRACT

A semiconductor light emitting device includes a light-transmissive substrate, a light-transmissive buffer layer disposed on the light-transmissive substrate, and a light emitting structure. The light-transmissive buffer layer includes a first layer and a second layer having different refractive indices and disposed alternately at least once. The light emitting structure includes a first conductivity-type semiconductor layer, an active layer, and a second conductivity-type semiconductor layer sequentially disposed on the buffer layer.

18 Claims, 15 Drawing Sheets

SEMICONDUCTOR LIGHT EMITTING DEVICE

CROSS-REFERENCE TO RELATED APPLICATION

This application claims benefit of the priority to Korean Patent Application No. 10-2013-0008310 filed on Jan. 24, 2013, in the Korean Intellectual Property Office, the entire contents of which are hereby incorporated by reference.

TECHNICAL FIELD

The present application relates to a semiconductor light emitting device.

BACKGROUND

A semiconductor light emitting device, generating light of various colors through electron-hole recombination, has many advantages, such as a relatively long lifespan, a low degree of power consumption, and the like. Thus, demand for semiconductor light emitting devices continues to rise. However, in a semiconductor light emitting device, when a semiconductor layer is grown, strain may be generated due to a difference in lattice constants and coefficients of thermal expansion between the semiconductor layer and a substrate, resulting in the generation of lattice defects.

Also, a difference in refractive indices between the semiconductor layer and an external material causes a considerable portion of light to be totally internally reflected, degrading light extraction efficiency. Thus, in the art, a method of improving a lattice defect and luminance efficiency of a semiconductor light emitting device is increasingly required.

SUMMARY

An aspect of the present application provides a semiconductor light emitting device in which a lattice defect is alleviated and luminance efficiency is improved in growing a semiconductor layer.

The objects of the present application are not limited thereto and may include objects or effects that may be recognized from a technical solution of a problem or embodiment described hereinbelow although not explicitly mentioned.

An aspect of the present application relates to a semiconductor light emitting device including a light-transmissive substrate, a light-transmissive buffer layer disposed on the light-transmissive substrate, and a light emitting structure. The buffer layer includes a first layer and a second layer having different refractive indices and disposed alternately at least once. The light emitting structure includes a first conductivity-type semiconductor layer, an active layer, and a second conductivity-type semiconductor layer sequentially formed on the buffer layer.

The first conductivity-type semiconductor layer may be contiguous with the first layer of the buffer layer, and the light-transmissive substrate may be contiguous with the second layer of the buffer layer.

The first conductivity-type semiconductor layer and the light-transmissive substrate may be contiguous with the first layer of the buffer layer.

The first layer may have a refractive index smaller than a refractive index of the first conductivity-type semiconductor layer and greater than a refractive index of the light-transmissive substrate.

Refractive indices of the first and second layers may range from about 1.4 to 2.5.

Thicknesses of the first and second layers may be different from each other.

The semiconductor light emitting device may include a plurality of first layers and a plurality of second layers, and the plurality of first layers and the plurality of second layers may have different thicknesses.

The buffer layer may further include a third layer having a refractive index different from refractive indices of the first layer and the second layer.

The first layer and the second layer may have pore densities different from each other.

The first layer and the second layer may include a porous GaN layer, respectively.

The first layer may include a first n-type GaN layer having a first doping density and the second layer may include a second n-type GaN layer having a second doping density different from the first doping density.

The semiconductor light emitting device may further include a wavelength conversion unit disposed on the light-transmissive substrate and configured to emit wavelength-converted light upon being excited by light emitted from the light emitting structure.

The buffer layer may allow light emitted from the light emitting structure to be transmitted therethrough and may reflect light emitted from the wavelength conversion unit.

The buffer layer may allow blue light to be transmitted therethrough and may reflect at least one of red light, green light, and yellow light.

Another aspect of the present application encompasses a semiconductor light emitting device including a light-transmissive buffer layer and a light emitting structure. The buffer includes a plurality of layers having different refractive indices laminated therein. The light emitting structure is disposed on the buffer layer and including an n-type semiconductor layer, a p-type semiconductor layer, and an active layer disposed therebetween.

Still another aspect of the present application relates to a semiconductor light emitting device including a light-transmissive buffer layer, a light emitting structure, a first electrode, and a wavelength conversion unit disposed on the light-transmissive buffer layer. The buffer layer includes a first layer and a second layer having different refractive indices and disposed alternately at least once. The light emitting structure includes a first conductivity-type semiconductor layer, an active layer, and a second conductivity-type semiconductor layer sequentially formed on the buffer layer. The first electrode is disposed on an exposed region of the first conductivity-type semiconductor layer.

The semiconductor light emitting device may include a second electrode disposed on an exposed region of the second conductivity-type semiconductor layer.

The semiconductor light emitting device may include a plurality of insulating patterns disposed on the first conductivity-type semiconductor layer. A plurality of nano-structures may be protruded from regions between the insulating patterns such that the nano-structures include the active layer and the second conductivity-type semiconductor layer, sequentially disposed on the first conductivity-type semiconductor layer.

The nano-structures may have a pyramidal shape or a nano-rod shape.

The semiconductor light emitting device may include a conductive substrate including a reflective material and disposed on a surface of the second conductivity-type semiconductor layer.

According to another aspect of the present application, there is provided a method for manufacturing a semiconductor light emitting device including: forming a light-transmissive buffer layer in which a first layer and a second layer having different refractive indices are disposed alternately at least once on a light-transmissive substrate; and forming a light emitting structure including a first conductivity-type semiconductor layer, a second conductivity-type semiconductor layer, and an active layer disposed therebetween on the buffer layer.

The first layer and the second layer may have different pore densities.

The forming of the light-transmissive buffer layer may include: forming an n-type GaN layer on the light-transmissive substrate; and performing electrochemical etching on the n-type GaN layer.

The forming of the n-type GaN layer on the light-transmissive substrate may include: forming n-type GaN layers having different doping densities alternately at least once on the light-transmissive substrate.

The method may further include: removing the light-transmissive substrate after the forming of the light emitting structure.

Refractive indices of the first and second layers may range from about 1.4 to 2.5.

Thicknesses of the first and second layers may be different.

A plurality of first layers and a plurality of second layers may be provided, and the plurality of first layers and the plurality of second layers may have different thicknesses, respectively.

The method may further include: forming a wavelength conversion unit emitting wavelength-converted light upon being excited by light emitted from the light emitting structure, on the light-transmissive substrate.

The buffer layer may allow light emitted from the light emitting structure to be transmitted therethrough and may reflect light emitted from the wavelength conversion unit.

The buffer layer may allow blue light to be transmitted therethrough and may reflect at least one of red light, green light, and yellow light. The foregoing technical solutions do not fully enumerate all of the features of the present application. The foregoing and other objects, features, aspects and advantages of the present application will become more apparent from the following detailed description of the present application when taken in conjunction with the accompanying drawings.

BRIEF DESCRIPTION OF THE DRAWINGS

The above and other aspects, features and other advantages of the present inventive concept will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
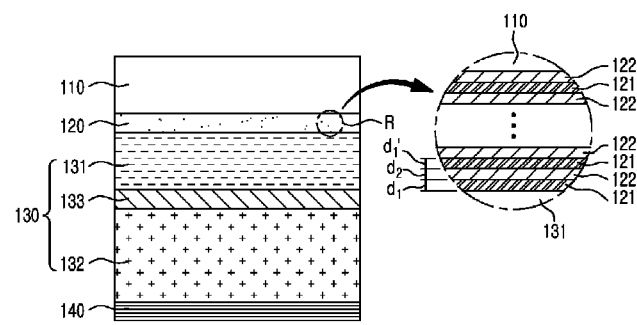
FIG. 1 is a cross-sectional view illustrating a semiconductor light emitting device and a buffer layer employed therein according to an embodiment of the present inventive concept.

Embodiments of the present inventive concept will now be described in detail with reference to the accompanying drawings.

The present inventive concept may, however, be embodied in many different forms and should not be construed as being limited to the embodiments set forth herein. Rather, these embodiments are provided so that this disclosure will be thorough and complete, and will fully convey the scope of the present inventive concept to those skilled in the art. In the drawings, the shapes and dimensions of elements may be exaggerated for clarity, and the same reference numerals will be used throughout to designate the same or like components.

FIG. 1 is a semiconductor light emitting device and a buffer layer employed therein according to an embodiment of the present inventive concept.

Referring to FIG. 1, a light emitting device according to an embodiment of the present inventive concept may include a light-transmissive substrate 110 and a light-transmissive buffer layer 120 and a light emitting structure 130 formed on the light-transmissive substrate 110. A reflective layer 140 may be formed on a side of the light omitting structure 130 opposite to a side thereof contiguous with the buffer layer 120.

The light-transmissive substrate 110 may be a substrate made of sapphire. Sapphire is a crystal having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, a nitride thin film may be relatively easily grown on the C-plane of sapphire crystal, and because sapphire crystal is stable at high temperatures, a sapphire substrate is commonly used as a nitride growth substrate. However, the present inventive concept is not limited thereto. For example, a silicon (Si) substrate, which is more appropriate for increasing a diameter and relatively low in price, may be used as the light-transmissive substrate 110. Alternatively, a substrate made of a material such as $MgAl_2O_4$, $MgO$, $LiAlO_2$, $LiGaO_2$, or the like, may also be used. Also, an upper surface of the light-transmissive substrate 110 may be provided as a light emitting surface of the light emitting device and may have translucency allowing light generated in the light emitting structure 130 to be easily emitted therethrough.

The light emitting structure 130 may include a first conductivity-type semiconductor layer 131, a second conductivity-type semiconductor layer 132, and an active layer 133 disposed therebetween. In an embodiment of the present inventive concept, the first and second conductivity-type semiconductor layers 131 and 132 may be an n-type semiconductor layer and a p-type semiconductor layer, respectively. For example, the first and second conductivity-type semiconductor layers 131 and 132 may be made of nitride semiconductor. In this case, first and second conductivity-type semiconductor layers 131 and 132 may have an empirical formula $Al_xIn_yGa_{(1-x-y)}N$ (here, $0 \leq x \leq 1, 0 \leq y \leq 1, 0 \leq x+y \leq 1$), to which a material such as GaN, AlGaN, InGaN, and the like, corresponds.

The active layer 133 may emit light having a predetermined wavelength according to the recombination of electrons provided from the first or second conductivity-type semiconductor layer 131 or 132 and holes provided from the second or first conductivity-type semiconductor layer 132 or 131. The active layer 133 may have a multi-quantum well (MQW) structure in which quantum well layers and quantum barrier layers are alternately laminated. Here, the MQW structure may be, for example, an InGaN/GaN structure.

The first and second conductivity-type semiconductor layers 131 and 132 and the active layer 133 may be formed by using a semiconductor growth process such as metal-organic chemical vapor deposition (MOCVD), molecular beam epitaxy (MBE), hydride vapor phase epitaxy (HVPE), or the like.

Meanwhile, the light-transmissive substrate 110 and the light emitting structure 130 may have a difference in lattice constants and coefficients of thermal expansion. For example, when the light emitting structure 130 made of a nitride semiconductor is formed on a sapphire substrate employed as the light-transmissive substrate 110, crystal lattice quality of the light emitting structure 130, in particular, the first conductivity-type semiconductor layer 131 according to an embodiment of the present inventive concept, may be degraded due to a difference in the lattice constants and the coefficients of thermal expansion between the both materials.

Thus, the light emitting device according to an embodiment of the present inventive concept may include the buffer layer 120 formed on the light-transmissive substrate 110. One surface of the buffer layer 120 may be contiguous with the light-transmissive substrate 110, and a surface thereof opposed to the one surface may be contiguous with the light emitting structure 130. The buffer layer 120 may be made of a material having a lattice constant that is not significantly different from a lattice constant of the light emitting structure 130. For example, when the light emitting structure 130 employs a nitride semiconductor, the buffer layer 120 may also employ the same material, e.g., a nitride semiconductor. In this manner, the buffer layer 120 may be provided as a growth surface of the light emitting structure 130 to prevent propagation of a dislocation defect to an upper portion when the light emitting structure 130 is formed. Thus, a high quality semiconductor light emitting device may be obtained, and thus, internal quantum efficiency can be increased.

In addition, in an embodiment of the present inventive concept, the buffer layer 120 may be made of a material having translucency allowing light emitted from the light emitting structure 130 to be emitted to an external material (substrate, air, etc.). For example, the buffer layer 120 may be made of a material selected from ZrN, CrN, ZrC, ZnO, TiC, TaC, $Ga_2O_3$, $Cr_2O_3$, AlN, GaN, or a combination thereof. In detail, in the case of using a GaN material, the buffer layer 120 may include porous GaN.

The buffer layer 120 may include a plurality of layers having different refractive indices. For example, a first layer 121 and a second layer 122 may be disposed alternately at least once. Here, the first layer 121 and the second layer 122 may have different thicknesses d1 and d2, and when a plurality of first layers 121 and a plurality of second layers 122 are provided, the plurality of first layers 121 and the plurality of second layers 122 may have different thicknesses. For example, when the plurality of first layers 121 are used, one of the first layers 121 and another of the first layers 121, at least, may have different thicknesses d1 and d1'.

Meanwhile, embodiments of the present inventive concept include a configuration in which one first layer 121 and one second layer 122 are alternately disposed once, as well as a configuration in which two or more first layers 121 and two or more second layers 122 are alternately disposed. For example, an embodiment of the present inventive concept includes a configuration in which "a first layer 121 and a second layer 122" (in that order) are laminated to be a pair or "a second layer 122 and a first layer 121" (in that order) are laminated to be a pair.

A refractive index of the first layer 121 and a refractive index of the second layer 122 may be determined within a range of about 1.4 to 2.5. The refractive index of the first layer 121 and the refractive index of the second layer 122 may be a value below refractive indices of the first conductivity-type semiconductor layer 131 and the light-transmissive substrate 110 or may be smaller than the refractive index of the first conductivity-type semiconductor layer 131 and greater than the refractive index of the light-transmissive substrate 110.

The difference in the refractive indices may be implemented by forming the first layer 121 and the second layer 122, both constituting the buffer layer 120, with heterogeneous light-transmissive materials having different refractive indices, respectively. Such materials may include a nitride, a carbide, or an oxide. For example, two types of layers selected from ZrN, CrN, ZrC, ZnO, TiC, TaC, $Ga_2O_3$, $Cr_2O_3$, AlN or GaN, may be alternately laminated to implement a difference in refractive indices.

Alternatively, a desired difference in refractive indices may be implemented by using a pore density (or air gap density). An air gap has the same refractive index as a refractive index of air, having a tendency that as a pore density is higher, a refractive index is reduced. Thus, even in case of homogeneous materials, a desired difference between refractive indices may be obtained by differentiating pore densities. Here, a difference in pore density includes a case in which a pore density of one layer is 0 (e.g., there are no pores therein) and a pore density of another layer is greater than 0.

As for a difference in pore density, a porous material having translucency and having adjustable pore density may be used. For example, a desired difference in refractive indices may be implemented by using porous GaN layers having different pore densities.

Also, the buffer layer 120 may further include a third layer 123 to an nth layer (where n is a natural number equal to or greater than 4) having a refractive index different from refractive indices of the first layer 121 and the second layer 122, respectively. Various embodiments in which the buffer layer 120 has a plurality of layers having different refractive indices will be described in detail with reference to FIGS. 2 through 4.

Figure 2:
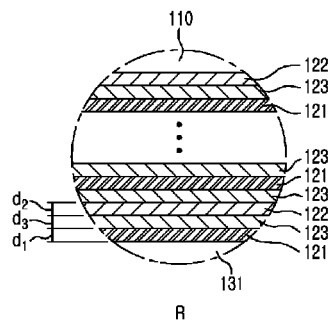
FIGS. 2 through 4 are cross-sectional views illustrating specific examples that may be employed in a buffer layer according to an embodiment of the present inventive concept.
Figure 3:
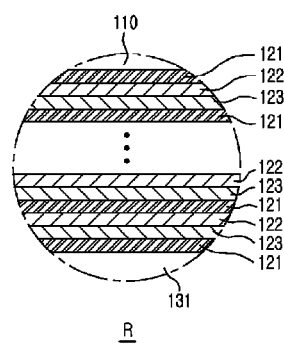
Figure 4:
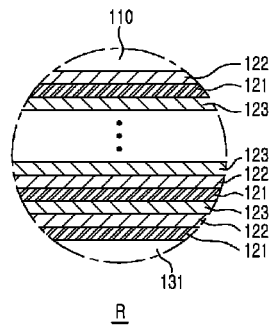

FIGS. 2 through 4 are views illustrating specific examples that may be employed in the buffer layer 120 according to an embodiment of the present inventive concept. FIGS. 2 through 4 are enlarged cross-sectional views of portion 'R' in FIG. 1.

First, referring to FIG. 2, the buffer layer 120 according to an embodiment of the present inventive concept may include the first layer 121 having a predetermined refractive index and the second layer 122 having a refractive index smaller than a refractive index of the first layer 121. The first layer 121 and the second layer 122 may be alternately disposed at least one or more times. At least one third layer 123 may be disposed between the first layer 121 and the second layer 122. A refractive index of the third layer 123 may be greater than a refractive index of the second layer 122 and smaller than a refractive index of the first layer 121, but the present inventive concept is not limited thereto.

The first conductivity-type semiconductor layer 131 and the light-transmissive substrate 110 may be contiguous with any one of the first, second, and third layers 121, 122, and 123. For example, the first conductivity-type semiconductor layer 131 and the light-transmissive substrate 110 may be contiguous with any one of a plurality of first layers 121. However, the present inventive concept is not limited thereto and the first conductivity-type semiconductor layer 131 may be contiguous with the first layer 121 and the light-transmissive substrate 110 may be contiguous with the second layer 122.

The first, second, and third layers 121, 122, and 123 may have a same thickness ($d_1=d_2=d_3$, see FIG. 2) or different thicknesses ($d_1 \neq d_2$, $d_1 \neq d_3$ and $d_2 \neq d_3$). Also, the first, second, and third layers 121, 122, and 123 may have different thicknesses, respectively. For example, when a plurality of first layers 121 are used, at least one of the first layers 121 may have a thickness different from a thickness of another of the first layers 121.

As illustrated in FIG. 2, the buffer layer 120 employed in an embodiment of the present inventive concept may include a plurality of layers laminated in order of 'a first layer (having a high refractive index)-a third layer (having an intermediate refractive index)-second layer (having a low refractive index)-a third layer (having an intermediate refractive index)' in a thickness direction of the first conductivity-type semiconductor layer 131.

Meanwhile, FIGS. 3 and 4 illustrate embodiments in which layers having different refractive indices are laminated.

Namely, when a refractive index of the first layer 121 is greater than a refractive index of the second layer 122 and a refractive index of the third layer is smaller than a refractive index of the first layer 121 and greater than a refractive index of the second layer 122, in the embodiment of FIG. 3, the buffer layer 120 may include a plurality of layers laminated in order of 'first layer (having a high refractive index)-third layer (having an intermediate refractive index)-second layer (having a low refractive index)-first layer (having a high refractive index)-third layer (having an intermediate refractive index)-second layer (having a low refractive index)' according to the magnitude of the refractive indices in a thickness direction of the first conductivity-type semiconductor layer 131 toward the light-transmissive substrate 110. Also, as illustrated, the first conductivity-type semiconductor layer 131 and the light-transmissive substrate 110 may be disposed to be contiguous with the first layer 121.

Meanwhile, in the embodiment of FIG. 4, the buffer layer 120 may include a plurality of layers laminated in order of 'first layer (having a high refractive index)-second layer (having a low refractive index)-third layer (having an intermediate refractive index)-first layer (having a high refractive index)-second layer (having a low refractive index)-third layer (having an intermediate refractive index)' in a thickness direction of the first conductivity-type semiconductor layer 131 toward the light-transmissive substrate 110.

However, the disposition of the refractive indices of the buffer layer 120 illustrated in FIGS. 1 through 4 is merely illustrative, and without being limited thereto, the first, second, and third layers of the buffer layer 120 may be variously disposed.

Hereinafter, advantages that may be attained by employing the buffer layer 120 including a plurality of layers having different refractive indices will be described in detail.

Figure 5:
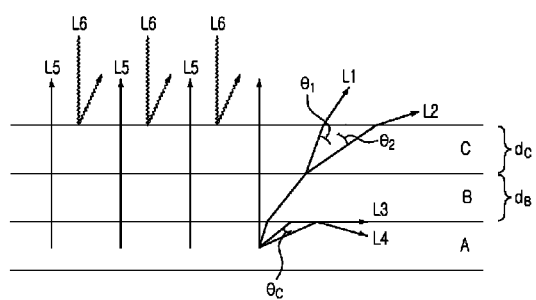
FIG. 5 is a view illustrating the characteristics of light moving to regions having different refractive indices.

FIG. 5 is a view illustrating the characteristics of light moving to a region having a different refractive index.

First, referring to an interface between region A and region B, when light passes through regions having different refractive indices, it is refracted at predetermined angles. Light L3 and L4 made incident at an angle greater than a total internal reflection critical angle are totally internally reflected, rather than being transmitted through an upper region. The total reflection critical angle is determined according to a difference of refractive index $n_A$ and $n_B$ between both interfaces, and in this case, the total internal reflection threshold value ($\theta_C$) is determined as $\arcsin(n_B/n_A)$.

Next, referring to an interface between the region B and region C, when the region C has a refractive index greater than a refractive index of the region B, light may be refracted upwardly at a predetermined angle ($\theta_1$) with respect to a direction in which the light has originally propagated, and conversely, when the region C has a refractive index smaller than a refractive index of the region B, light may be refracted downwardly at a predetermined angle ($\theta_2$) with respect to the direction in which the light has originally propagated.

Thus, when a refractive index is decreased in the upward direction, light, like L2, may move in the direction in which a slope thereof is reduced in a horizontal direction, and conversely, when refractive indices are alternately repeated, light, like L1, has an angle which is repeatedly increased and decreased in the horizontal direction. Thus, a direction of light can be controlled by adjusting the refractive indices and thicknesses ($d_B$, $d_C$) of the respective regions B and C. Also, by appropriately setting refractive indices and thicknesses of the respective regions, a dichroic mirror allowing light L5 having a particular wavelength to be transmitted and light L6 having a particular wavelength to be reflected based on an optical interference phenomenon may be implemented.

Namely, since the light emitting device according to an embodiment of the present inventive concept employs the buffer layer including a plurality of layers having different refractive indices, a lattice defect of the light emitting structure may be reduced and optical characteristics of the device can be improved.

In detail, when the light emitting device of FIG. 1 employs a nitride semiconductor as a material used to form the first conductivity-type semiconductor layer 131, a refractive index may correspond to approximately 2.5, and when the light emitting device of FIG. 1 employs sapphire as a material used to form the light-transmissive substrate 110, a refractive index corresponds to approximately 1.78. In case of disposing the buffer layer 120, which has a refractive index not significantly different from a refractive index of the first conductivity-type semiconductor layer 131, between the first conductivity-type semiconductor layer 131 and the light-transmissive substrate 110. Namely, for example, in a case of disposing the buffer layer 120, which has a refractive index greater than the refractive index (approximately 1.78) of the light-transmissive substrate 110 but smaller than the refractive index (approximately 2.5) of the first conductivity-type semiconductor layer 131, between the first conductivity-type semiconductor layer 131 and the light-transmissive substrate 100, a difference between refractive index is reduced relative to a configuration in which the first conductivity-type semiconductor layer 131 and the light-transmissive substrate 110 are contiguous, whereby a total internal reflection critical angle is increased and, therefore, light totally internally reflected in the device can be effectively reduced.

Also, since the buffer layer 120 employs a plurality of layers having different refractive indices, a direction of light extracted to the light-transmissive substrate 110 may be controlled, and the buffer layer 120 may serve as a dichroic mirror.

Figure 6A:
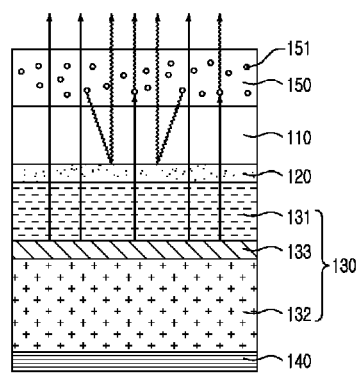
FIGS. 6A and 6B is a cross-sectional view of a semiconductor light emitting device according to an embodiment of the present inventive concept and a graph showing reflectivity over wavelength of a buffer layer of a semiconductor light emitting device according to an embodiment of the present inventive concept.
Figure 6B:
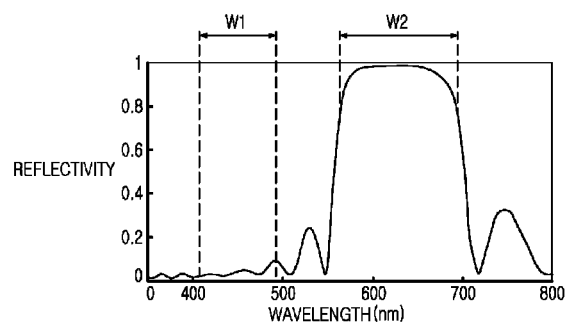

FIG. 6A is a cross-sectional view of a semiconductor light emitting device according to an embodiment of the present inventive concept, and FIG. 6B is a graph showing reflectivity over wavelength of the buffer layer 120 of the semiconductor light emitting device illustrated in FIG. 6A.

Referring to FIG. 6A, a light emitting device according to an embodiment of the present inventive concept may include the light-transmissive substrate 110 and the light-transmissive buffer layer 120 and the light emitting structure 130 formed on the light-transmissive substrate 110. The light emitting device according to an embodiment of the present inventive concept may further include a wavelength conversion unit 150 formed on a surface of the light-transmissive substrate 110 opposite to a surface thereof contiguous with the buffer layer 120.

The buffer layer 120 may include a plurality of layers having different refractive indices. For example, the buffer layer 120 may include a plurality of layers including the first layer 121 having a predetermined refractive index and the second layer 122 having a refractive index smaller than a refractive index of the first layer 121, which are disposed alternately at least once.

The wavelength conversion unit 150 may be disposed on the surface of the light-transmissive substrate 110 opposite to the buffer layer 120 and may include a wavelength conversion material 151, for example, at least one of a phosphor and a quantum dot, converting a wavelength of light emitted from the light emitting structure 130. For example, the phosphor may be a phosphor converting a wavelength of light into any one of yellow, red, and green, or a plurality of phosphor types may be mixed to convert light into a plurality of light wavelengths and may include at least one or more phosphor materials among a YAG-based phosphor material, a TAG-based phosphor material, a silicate-based phosphor material, a sulfide-based phosphor material, and a nitride-based phosphor material.

A quantum dot is a nano crystal of a semiconductor material having a diameter ranging from about 1 nm to 10 nm, exhibiting a quantum confinement effect. The quantum dot may be, for example, an Si-based nano crystal, a group II-VI compound semiconductor nano crystal, a group III-V compound semiconductor nano crystal, a group IV-VI compound semiconductor nano crystal, or the like, and in an embodiment of the present inventive concept, these nano crystals may be used alone as quantum dots or a mixture thereof may be used.

Referring to FIG. 6B, the buffer layer 120 may allow light having a particular wavelength range W1 to be transmitted therethrough, rather than to be reflected, and may have a high degree of reflectivity for light having a different wavelength range W2. The particular wavelength range W1 may be set to be within a wavelength range of light generated by the active layer 133 of the light emitting structure 130. For example, when the active layer 133 emits blue light, the particular light wavelength range W1 may be a wavelength band including a peak wavelength of blue light, and the other wavelength range W2 may be a wavelength range of light converted by the wavelength conversion unit 150. The converted light may be visible light having a wavelength longer than a wavelength of light generated by the active layer 133. For example, the converted light may be within the wavelength range of at least one of yellow light, red light, and green light.

Hereinafter, a specific embodiment will be described.

Figure 7A:
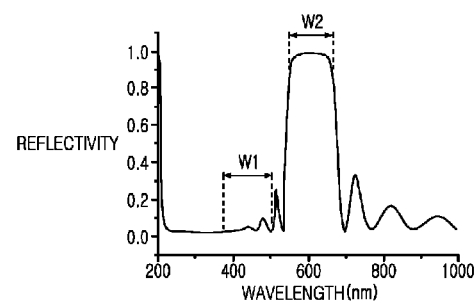
FIGS. 7A and 7B are graphs showing reflectivity over wavelength of a buffer layer according to an embodiment of the present inventive concept.
Figure 7B:
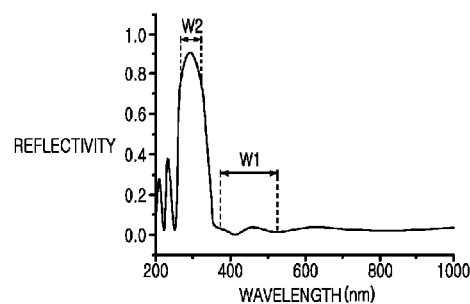

FIGS. 7A and 7B are graphs of experiment results showing reflectivity over wavelength of a buffer layer 120 according to Embodiment 1 and Embodiment 2 of the present inventive concept.

Embodiment 1

A light emitting device according to Embodiment 1 includes a buffer layer including (i) layer to (v) layer having the thicknesses and refractive indices shown in Table (see below) and laminated iteratively ten times. Among the layers, the 1-(i) layer disposed in the lowermost position is contiguous with the first conductivity-type semiconductor layer 131, and the 10-(v) layer disposed in the uppermost position is contiguous with the light-transmissive substrate 110. GaN, porous GaN, and sapphire were employed as materials used to form the light emitting structure 130, the buffer layer 120, and the light-transmissive substrate 110, respectively.

TABLE 1

| Lamination order | Refractive index | Thickness (nm) | Classification as first layer or second layer |
| --- | --- | --- | --- |
| 10-(v) | 2 | 37.5 | First layer |
| 10-(iv) | 1.5 | 100 | Second layer |
| 10-(iii) | 2 | 75 | First layer |
| . | . | . | . |
| . | . | . | . |
| . | . | . | . |
| 2-(iii) | 2 | 75 | First layer |
| 2-(ii) | 1.5 | 100 | Second layer |
| 2-(i) | 2 | 37.5 | First layer |
| 1-(v) | 2 | 37.5 | |
| 1-(iv) | 1.5 | 100 | Second layer |
| 1-(iii) | 2 | 75 | First layer |
| 1-(ii) | 1.5 | 100 | Second layer |
| 1-(i) | 2 | 37.5 | First layer |

Refractive indices of the first layer and the second layer used in Embodiment 1 were 2 and 1.5, respectively, and a plurality of first layers had different thicknesses. In detail, a thickness of the first layer 1-(i) disposed in the lowermost position and a thickness of the first layer 10-(v) disposed in the uppermost position were 37.5 nm, and the other first layers, excluding them, had a thickness equal to 75 nm. A plurality of second layers were formed to have the same thickness (100 nm).

Regarding reflection characteristics of the buffer layer 120 in relation to Embodiment 1, referring to FIG. 7A, the buffer layer 120 allowed light having the wavelength region W1 ranging from about 400 nm to 500 nm including a blue light wavelength region to be transmitted therethrough, and in this case, it can be seen that light reflectance was substantially 0%. Meanwhile, it can be seen that reflectance of light within other wavelength regions was increased. In particular, it can be seen that with light having a wavelength region longer than that of blue light, e.g., the wavelength region W2 ranging from about 550 nm to 680 nm, reflectance was equal to or greater than approximately 90%.

Embodiment 2

A light emitting device according to Embodiment 2 includes a buffer layer including (i) layer to (v) layer having the thicknesses and refractive indices shown in Table (see below) and laminated iteratively six times. Like Embodiment 1, the 1-(i) layer disposed in the lowermost position is contiguous with the first conductivity-type semiconductor layer 131, and the 6-(v) layer disposed in the uppermost position is contiguous with the light-transmissive substrate 110. Also, GaN, porous GaN, and sapphire were employed as materials used to form the light emitting structure 130, the buffer layer 120, and the light-transmissive substrate 110, respectively.

TABLE 2

| Lamination order | Refractive index | Thickness (nm) | Classification of first layer and second layer |
|---|---|---|---|
| 6-(v) | 1.5 | 25 | Second layer |
| 6-(iv) | 2 | 37.5 | First layer |
| 6-(iii) | 1.5 | 25 | Second layer |
| . | . | . | . |
| . | . | . | . |
| . | . | . | . |
| 2-(iii) | 1.5 | 25 | Second layer |
| 2-(ii) | 2 | 37.5 | First layer |
| 2-(i) | 1.5 | 25 | Second layer |
| 1-(v) | 1.5 | 25 | |
| 1-(iv) | 2 | 37.5 | First layer |
| 1-(ii) | 1.5 | 25 | Second layer |
| 1-(ii) | 2 | 37.5 | First layer |
| 1-(i) | 1.5 | 25 | Second layer |

Refractive indices of the first layer and the second layer used in an embodiment of the present inventive concept were 2 and 1.5, respectively, and a plurality of second layers had different thicknesses (25 nm and 50 nm). Here, a plurality of first layers were formed to have a same thickness (37.5 nm).

Regarding reflection characteristics of the buffer layer 120 in relation to Embodiment 2, referring to FIG. 7B, the buffer layer 120 allowed light having the wavelength region W1 ranging from about 400 nm to 600 nm including blue light and green light wavelength regions to be transmitted therethrough, and in this case, it can be seen that light reflectance was nearly 0%. Meanwhile, it can be seen that reflectance of light within other wavelength regions was increased, and in particular, it can be seen that with light having a wavelength region shorter than a wavelength of blue light, in particular, the wavelength region W2 ranging from about 280 nm to 340 nm, reflectance was equal to or greater than approximately 80% to 90%.

In Embodiment 1 and Embodiment 2, the buffer layer 120 may allow blue light (e.g., light having a wavelength ranging from about 435 nm to 480 nm) or blue light and green light (light having a wavelength ranging from about 500 nm to 560 nm) generated in the light emitting structure 130 to be transmitted therethrough, and reflect at least one of red light (having a wavelength ranging from about 605 nm to 770 nm), yellow light (having a wavelength ranging from about 580 nm to 595 nm), and green light.

Namely, in the semiconductor light emitting device according to an embodiment of the present inventive concept, crystal lattice quality of the light emitting structure is improved, light extraction efficiency of the light emitting structure to the light-transmissive substrate 110 is improved, and ambient light made incident from the light-transmissive substrate 110, e.g., light converted by the wavelength conversion unit 150 is externally reflected, increasing luminance efficiency. Also, directionality of light extracted to the light-transmissive substrate 110 can be controlled.

Hereinafter, a method of manufacturing a light emitting device according to an embodiment of the present inventive concept will be described.

FIGS. 8A through 8D are views illustrating a method of manufacturing a semiconductor light emitting device according to an embodiment of the present inventive concept.

A method of manufacturing a light emitting device according to an embodiment of the present inventive concept may start from an operation of forming a light-transmissive buffer layer including a first layer and a second layer having different refractive indices and disposed alternately at least once on a light-transmissive substrate.

Figure 8A:
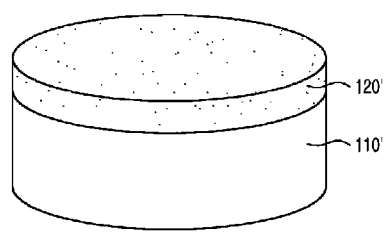
FIGS. 8A through 8D are views illustrating a method of manufacturing a semiconductor light emitting device according to an embodiment of the present inventive concept.

In detail, referring to FIG. 8A, first, a light-transmissive buffer layer 120' may be formed on a light-transmissive substrate 110'.

The light-transmissive substrate 110' may be provided as a semiconductor growth substrate which may be a wafer before being cut into individual device units. The light-transmissive substrate 110' may be made of sapphire.

The light-transmissive buffer layer 120' may be an n-type GaN layer doped with an n-type impurity. The buffer layer 120' may be formed by using a semiconductor growth process such as MOCVD, MBE, HVPE, or the like.

Figure 8B:
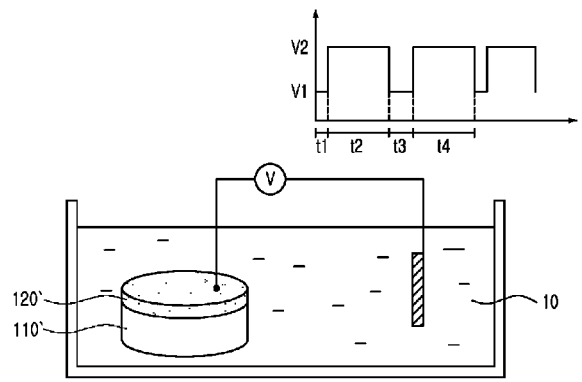

Next, as illustrated in FIG. 8B, electrochemical etching may be performed on the light-transmissive buffer layer 120'.

In detail, when the light-transmissive substrate 110' with the n-type GaN layer formed thereon may be immersed in an oxalic acid or nitric acid solution 10 and a voltage may be subsequently applied through an electrode, the n-type GaN layer may turn to a porous GaN layer including pores formed in a thickness direction according to a change in the applied voltage. In this case, as a higher voltage is applied, an etching reaction may be activated, so pore density formed in the porous GaN layer may be changed according to an applied voltage. A refractive index of the porous GaN layer may be lowered as the porous density thereof is higher, thus, a plurality of layers having different refractive indices may be formed.

In detail, when a first layer having a relatively high refractive index is formed to be thinner in the uppermost layer of the n-GaN layer, a relatively low voltage level V1 may be applied for a relatively shorter period of time t1.

Thereafter, when a second layer having a relatively low refractive index is formed below the first layer to be relatively thick, a relatively high voltage level V2 may be applied for a relatively longer period of time t2. In this manner, refractive indices and thicknesses of the first layer and the second layer may be adjusted by controlling the voltage levels and the application period of times.

Figure 8C:
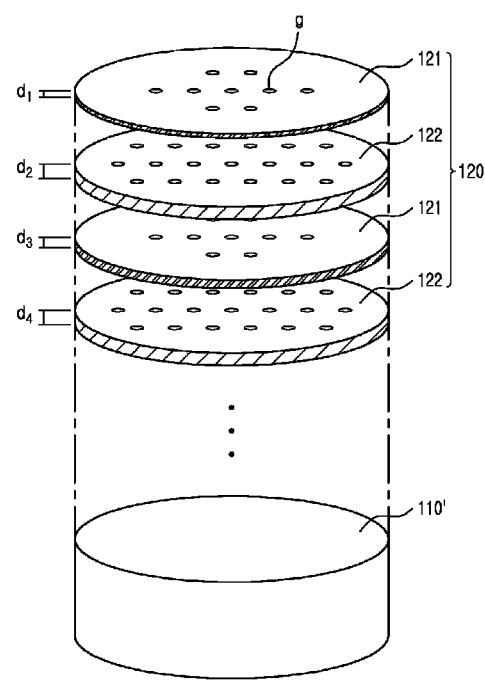

FIG. 8C illustrates a buffer layer after electrochemical etching is completed.

Referring to FIG. 8C, the buffer layer 120 includes a plurality of layers including the first layer 121 and the second layer 122 having different refractive indices. Thicknesses d1, d2, d3, d4 . . . of the plurality of respective layers are proportional to the period of times t1, t2, t3, t4, . . . at the voltage levels applied in the electrochemical etching. As illustrated, the first layer 121 has a pore (g) density lower than a pore density of the second layer 122, so the first layer 121 may have a refractive index higher than that of the second layer 122.

Figure 8D:
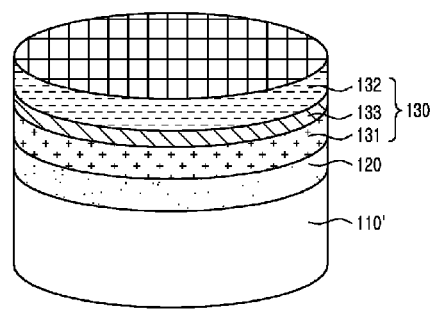

Thereafter, as illustrated in FIG. 8D, the light emitting structure 130 may be formed on the buffer layer 120. In this operation, the first conductivity-type semiconductor layer 131, the active layer 133, and the second conductivity-type semiconductor layer 132 may be sequentially laminated on the buffer layer 120.

Thereafter, the lamination may be cut into individual device units to prepare light emitting devices in chip units. According to circumstances, the light-transmissive substrate 110' may be removed by using a process such as grinding, chemical lift-off (CLO), laser lift-off (LLO), or the like.

Meanwhile, voltage waveforms applied in the electrochemical etching according to an embodiment of the present inventive concept may have various patterns as necessary.

Figure 9A:
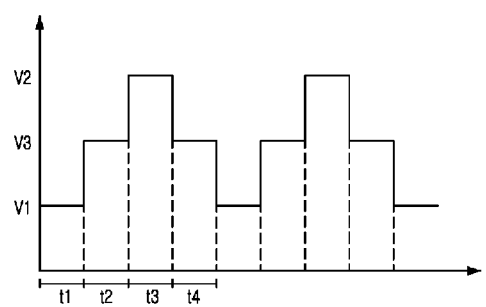
FIGS. 9A through 9C are graphs showing voltage waveforms applied in electrochemical etching according to an embodiment of the present inventive concept.
Figure 9B:
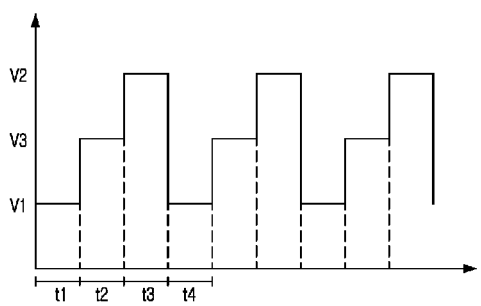
Figure 9C:
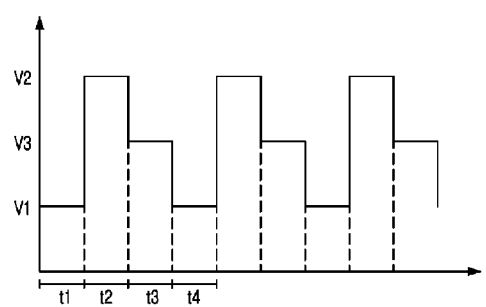

FIGS. 9A through 9C are graphs showing voltage waveforms applied in electrochemical etching according to an embodiment of the present inventive concept.

In detail, as illustrated in FIGS. 9A through 9C, electrochemical etching may be performed by dividing a voltage level into three levels V1, V2, and V3, to obtain a buffer layer including first to third layers having different refractive indices. For example, the buffer layer illustrated in FIG. 2 may be obtained by applying a voltage having the pattern of FIG. 9A. Similarly, the buffer layer illustrated in FIGS. 3 and 4 may be obtained by applying a voltage having the pattern of FIGS. 9B and 9C, respectively.

Figure 10A:
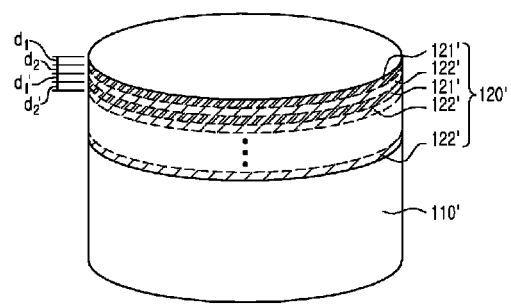
FIGS. 10A through 10C are views illustrating a method of manufacturing a semiconductor light emitting device according to another embodiment of the present inventive concept.
Figure 10B:
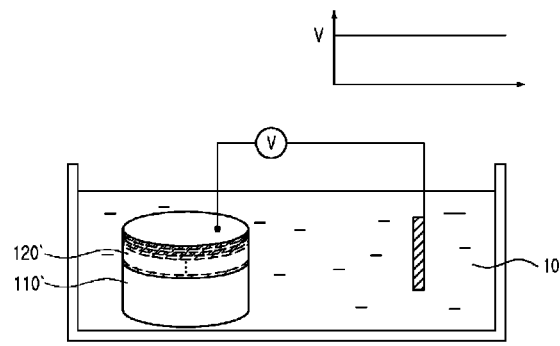
Figure 10C:
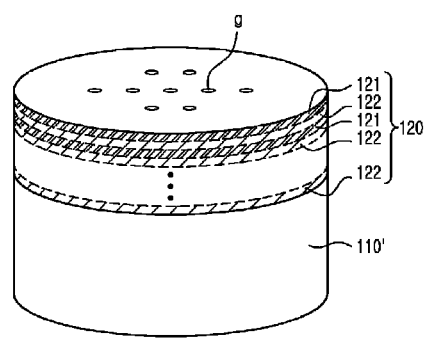

FIGS. 10A through 10C are views illustrating a method of manufacturing a semiconductor light emitting device according to another embodiment of the present inventive concept.

In this embodiment, electrochemical etching may be performed by using a method different from the method described above with reference to FIGS. 8A-8D. Here, a description of portions that may be applied in the same manner as that of the manufacturing method of FIGS. 8A-8D will be omitted.

Referring to FIG. 10A, a light-transmissive buffer layer 120' formed on a light-transmissive substrate 110' may include n-type GaN layers 121' and 122' having different doping densities. In detail, second n-type GaN layers 122' having a second doping density and first n-type GaN layers 121' having a doping density lower than the second doping density may be alternately formed on the light-transmissive substrate 110'.

Subsequently, as illustrated in FIG. 10B, electrochemical etching may be performed. In an embodiment of the present inventive concept, a magnitude of a voltage applied to the n-type GaN layer 120' may be uniformly maintained during the electrochemical etching. In this case, as a doping density is higher, an electrochemical etching reaction may be accelerated. Thus, although the constant voltage magnitude is applied, the structure in which the first layers 121 and the second layers 122 having different refractive indices are alternately disposed as illustrated in FIG. 10C may be obtained.

Namely, the first n-type GaN layer 121' having relatively a low doping density may become a porous GaN layer having a low pore density (g), which may be provided as the first layer 121 having high refractive index. Meanwhile, the second n-type GaN layer 122' having a relatively high doping density may become a porous GaN layer including high pore density (g), which may be provided as the second layer 122.

In this manner, the respective refractive indices and thicknesses of the first layer 121 and the second layer 122 may be adjusted by controlling the doping densities and thicknesses d1, d2, d1', d2' of the first and second n-type GaN layers 121' and 122' having different doping densities.

Meanwhile, the method of manufacturing a light emitting device according to an embodiment of the present inventive concept is not limited to the foregoing content, and the light emitting device according to an embodiment of the present inventive concept may be manufactured by alternately disposing materials, e.g., ZrN, CrN, ZrC, ZnO, TiC, TaC, $Ga_2O_3$, $Cr_2O_3$, AlN, and the like, that may be employed in the buffer layer, in consideration of refractive indices thereof.

Figure 11:
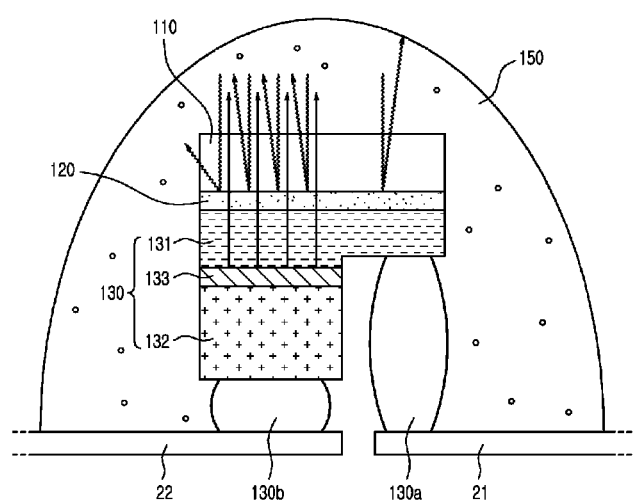
FIGS. 11 through 13 are cross-sectional views of a semiconductor light emitting device according to another embodiment of the present inventive concept.
Figure 12A:
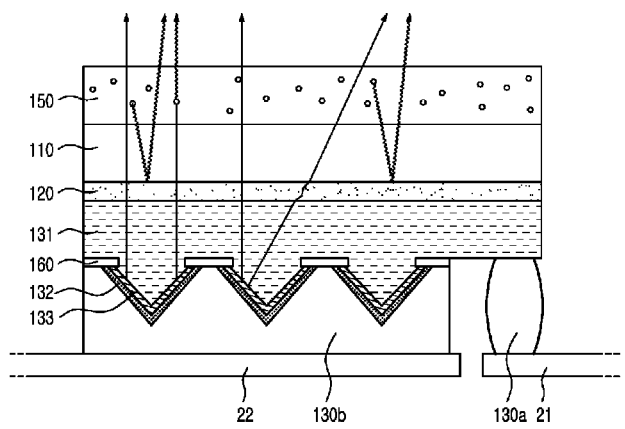
Figure 12B:
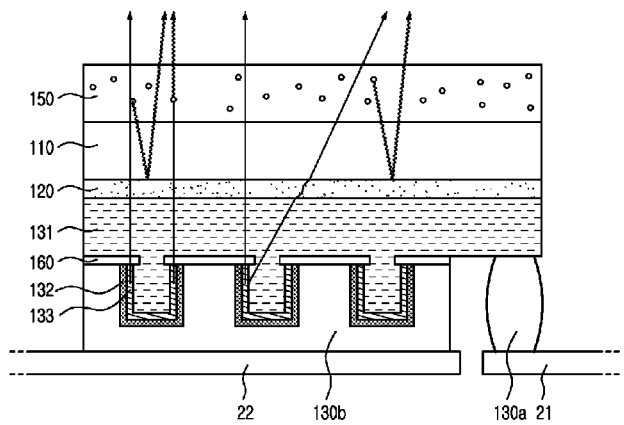
Figure 13:
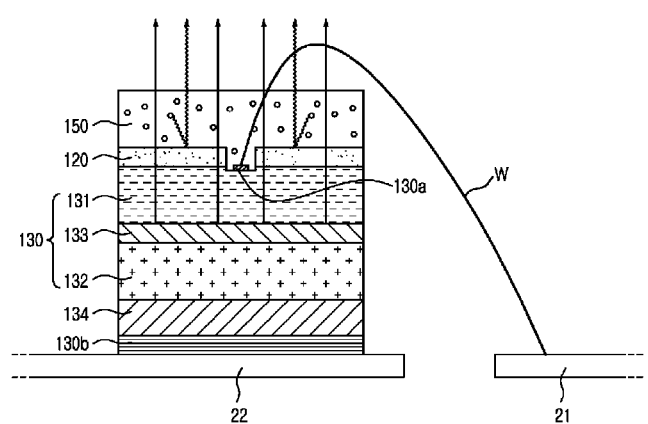

FIGS. 11 through 13 are cross-sectional views of a semiconductor light emitting device according to another embodiment of the present inventive concept.

Referring to FIG. 11, a light emitting device according to an embodiment of the present inventive concept may include the light-transmissive substrate 110 and the light-transmissive buffer layer 120 and the light emitting structure 130 formed on the light-transmissive substrate 110.

The light emitting structure 130 may include the first and second conductivity-type semiconductor layers 131 and 132 and the active layer 133 disposed therebetween. The first conductivity-type semiconductor layer 131 may have a region exposed, as portions of the second conductivity-type semiconductor layer 132 and the active layer 133 are removed for a formation of an electrode. First and second electrodes 130a and 130b may be formed on the exposed region of the first conductivity-type semiconductor layer 131 and on the second conductivity-type semiconductor layer 132 in order to apply driving power to the light emitting device, respectively. The first and second electrodes 130a and 130b may be electrically connected to first and second terminal units 21 and 22 to receive applied driving power.

Also, as illustrated in FIG. 11, the light emitting device according to an embodiment of the present inventive concept may further include a wavelength conversion unit 150 encapsulating the light emitting device. Here, the buffer layer 120 may include a plurality of layers having different refractive indices and serve to improve efficiency of extracting light emitted from the light emitting structure to the light-transmissive substrate 110. Also, the buffer layer 120 may be formed, by adjusting refractive indices and thicknesses of the plurality of layers included therein, such that light emitted from the light emitting structure is allowed to be transmitted to the light-transmissive substrate 110 and light made incident through the light-transmissive substrate 110 after being emitted from the wavelength conversion unit 150 to be reflected.

Thereafter, referring to FIGS. 12A and 12B, a light emitting device according to an embodiment of the present inventive concept may include a plurality of nano-structures. Here, a description of the same elements as those of FIG. 11 will be omitted. The first conductivity-type semiconductor layer 131 may include nano-structures protruded from regions between insulating patterns 160. The active layer 133 and the second conductivity-type semiconductor layer 132 may cover the protruded nano-structures of the first conductivity-type semiconductor layer 131. As illustrated in FIG. 12A, the nano-structures may have a pyramidal shape, but the present inventive concept is not limited thereto and may have a nano-rod shape as illustrated in FIG. 12B.

The first conductivity-type semiconductor layer 131 may include a region exposed for a formation of the first electrode 130a, and the first electrode 130a may be formed on the exposed region of the first conductivity-type semiconductor layer. The second electrode 130b may be formed on the second conductivity-type semiconductor layer 132. Here, the second electrode 130b may be provided as a conductive layer covering the second conductivity-type semiconductor layer 132. The conductive layer may be made of a reflective material to allow light generated by the active layer 133 to be easily reflected upward.

FIG. 13 illustrates an example of a light emitting device in which first and second electrodes are formed on upper and lower surfaces of the light emitting device, respectively.

In detail, the light emitting device according to an embodiment of the present inventive concept may include the light-transmissive buffer layer 120 and the light emitting structure 130 formed on the buffer layer 120. Unlike the embodiment illustrated in FIG. 11, referring to FIG. 13, a light-transmissive substrate is omitted according to an embodiment of the present inventive concept.

The light emitting structure 130 may include the first and second conductivity-type semiconductor layers 131 and 132 and the active layer 133 disposed therebetween, and further include a conductive substrate 134 formed on a lower surface of the second conductivity-type semiconductor layer 132. The conductive substrate 134 may include a reflective material. The first conductivity-type semiconductor layer 131 may have a region exposed, as a portion of the buffer layer 120 is removed. The first electrode 130a may be formed on the exposed region and connected to the terminal unit 21 through a conductive wire W.

Also, the light emitting device may further include a wavelength conversion unit 150 formed on the buffer layer 120. As illustrated, the wavelength conversion unit 150 may only be formed on the region defined by an upper surface of the light emitting device.

The buffer layer 120 may include a plurality of layers having different refractive indices which serve to improve efficiency of extracting light emitted from the light emitting structure 130 externally (e.g., the wavelength conversion unit or air). Also, the buffer layer 120 may allow light (e.g., blue light) emitted from the light emitting structure 130 to be transmitted therethrough and light (e.g., at least one of yellow light, green light, and red light) emitted from the wavelength conversion unit to be reflected, thereby providing excellent luminance efficiency.

As set forth above, according to embodiments of the present inventive concept, a semiconductor light emitting device, in which a lattice defect of the semiconductor layer is reduced and light extraction efficiency is improved, can be obtained.

However, advantages and effects of the present inventive concept are not limited to the foregoing content and a person skilled in the art may easily understand any other technical effect not mentioned from the above descriptions.

While the present inventive concept has been shown and described in connection with the embodiments, it will be apparent to those skilled in the art that modifications and variations can be made without departing from the spirit and scope of the present inventive concept as defined by the appended claims.

What is claimed is:

1. A semiconductor light emitting device, comprising:
a light-transmissive substrate;
a light-transmissive buffer layer disposed on the light-transmissive substrate and including a plurality of first layers and a plurality of second layers having different refractive indices and disposed alternately,
wherein the plurality of first layers and the plurality of second layers have different thicknesses; and
a light emitting structure including a first conductivity-type semiconductor layer, an active layer, and a second conductivity-type semiconductor layer sequentially disposed on the buffer layer.

2. The semiconductor light emitting device of claim 1, wherein:
the first conductivity-type semiconductor layer is contiguous with one of the first layers of the buffer layer, and
the light-transmissive substrate is contiguous with one of the second layers of the buffer layer.

3. The semiconductor light emitting device of claim 1, wherein the first conductivity-type semiconductor layer and the light-transmissive substrate are contiguous with one of the first layers of the buffer layer.

4. The semiconductor light emitting device of claim 1, wherein the first layers have a refractive index smaller than a refractive index of the first conductivity-type semiconductor layer and greater than a refractive index of the light-transmissive substrate.

5. The semiconductor light emitting device of claim 1, wherein refractive indices of the first and second layers range from about 1.4 to about 2.5.

6. The semiconductor light emitting device of claim 1, wherein the buffer layer further includes a third layer having a refractive index different from refractive indices of the first layers and the second layers.

7. The semiconductor light emitting device of claim 1, wherein the first layers and the second layers have pore densities different from each other.

8. The semiconductor light emitting device of claim 7, wherein the first layers and the second layers include a porous GaN layer, respectively.

9. The semiconductor light emitting device of claim 7, wherein:
the first layers include a first n-type GaN layer having a first doping density, and
the second layers include a second n-type GaN layer having a second doping density different from the first doping density.

10. The semiconductor light emitting device of claim 1, further comprising:
a wavelength conversion unit disposed on the light-transmissive substrate and configured to emit wavelength-converted light upon being excited by light emitted from the light emitting structure.

11. The semiconductor light emitting device of claim 10, wherein the buffer layer allows light emitted from the light emitting structure to be transmitted therethrough and reflects light emitted from the wavelength conversion unit.

12. The semiconductor light emitting device of claim 11, wherein the buffer layer allows blue light to be transmitted therethrough and reflects at least one of red light, green light, and yellow light.

13. A semiconductor light emitting device comprising:
a light-transmissive buffer layer including a plurality of first layers and a plurality of second layers disposed alternately having different refractive indices laminated therein,
wherein the plurality of first layers and the plurality of second layers have different thicknesses; and
a light emitting structure disposed on the buffer layer and including an n-type semiconductor layer, a p-type semiconductor layer, and an active layer disposed therebetween.

14. A semiconductor light emitting device, comprising:
a light-transmissive buffer layer including a plurality of first layers and a plurality of second layers having different refractive indices and disposed alternately
wherein the plurality of first layers and the plurality of second layers have different thicknesses;
a light emitting structure including a first conductivity-type semiconductor layer, an active layer, and a second conductivity-type semiconductor layer sequentially disposed on the buffer layer;
a first electrode disposed on an exposed region of the first conductivity-type semiconductor layer; and
a wavelength conversion unit disposed on the light-transmissive buffer layer.

15. The semiconductor light emitting device of claim 14, further comprising a second electrode disposed on an exposed region of the second conductivity-type semiconductor layer.

16. The semiconductor light emitting device of claim 14, further comprising:
- a plurality of insulating patterns disposed on the first conductivity-type semiconductor layer; and
- a plurality of nano-structures protruded from regions between the insulating patterns such that the nano-structures include the active layer and the second conductivity-type semiconductor layer, sequentially disposed on the first conductivity-type semiconductor layer.

17. The semiconductor light emitting device of claim 16, wherein the nano-structures have a pyramidal shape or a nano-rod shape.

18. The semiconductor light emitting device of claim 14, further comprising:
- a conductive substrate including a reflective material and disposed on a surface of the second conductivity-type semiconductor layer.

* * * * *